(12) United States Patent
Johnstone et al.

(10) Patent No.: US 8,975,193 B2
(45) Date of Patent: Mar. 10, 2015

(54) METHOD OF MAKING A MICROFLUIDIC DEVICE

(75) Inventors: Robert Johnstone, Montreal (CA); Stephane Martel, La Prairie (CA)

(73) Assignee: Teledyne DALSA Semiconductor, Inc., Thousand Oaks, CA (US)

( * ) Notice: Subject to any disclaimer, the term of this patent is extended or adjusted under 35 U.S.C. 154(b) by 516 days.

(21) Appl. No.: 13/196,421

(22) Filed: Aug. 2, 2011

(65) Prior Publication Data

US 2013/0034467 A1 Feb. 7, 2013

(51) Int. Cl.
*H01L 21/00* (2006.01)
*B81C 3/00* (2006.01)
*B81B 7/00* (2006.01)
*B81C 1/00* (2006.01)

(52) U.S. Cl.
CPC ....... *B81C 1/00182* (2013.01); *B81B 2201/054* (2013.01); *B81C 2201/019* (2013.01); *B81C 2203/0735* (2013.01)
USPC ........... 438/761; 422/500; 422/502; 422/503; 438/758; 438/759

(58) Field of Classification Search
USPC ................................................. 422/500–509
See application file for complete search history.

(56) References Cited

U.S. PATENT DOCUMENTS

| 5,216,273 | A | 6/1993 | Doering et al. |
|---|---|---|---|
| 5,380,396 | A | 1/1995 | Shikida et al. |
| 5,876,675 | A | 3/1999 | Kennedy |
| 5,901,939 | A | 5/1999 | Cabuz et al. |
| 5,914,507 | A | 6/1999 | Polla et al. |
| 6,136,212 | A | 10/2000 | Mastrangelo et al. |
| 6,351,054 | B1 | 2/2002 | Cabuz et al. |

(Continued)

FOREIGN PATENT DOCUMENTS

| EP | 1 314 472 A1 | 5/2003 |
|---|---|---|
| EP | 2 022 753 A1 | 2/2009 |
| WO | 01/09598 A1 | 2/2001 |

OTHER PUBLICATIONS van der Wouden et al., Field-effect control of electro-osmotic flow in microfluidic networks, Colloids and Surfaces A: Physicochemical and Engineering Aspects, vol. 267, Issues 1-3, Oct. 5, 2005, pp. 110-116.*

(Continued)

*Primary Examiner* — Paul Hyun
*Assistant Examiner* — Robert Eom
(74) *Attorney, Agent, or Firm* — Marks & Clerk

(57) ABSTRACT

A microfabricated device is fabricated by depositing a first metal layer on a substrate to provide a first electrode of an electrostatic actuator, depositing a first structural polymer layer over the first metal layer, depositing a second metal layer over said first structural polymer layer to form a second electrode of the electrostatic actuator, depositing an insulating layer over said first structural polymer layer, planarizing the insulating layer, etching the first structural polymer layer through the insulating layer and the second metal layer to undercut the second metal layer, providing additional preformed structural polymer layers, at least one of which has been previously patterned, and finally bonding the additional structural layers in the form of a stack over the planarized second insulating layer to one or more microfluidic channels. The technique can also be used to make cross over channels in devices without electrostatic actuators, in which case the metal layers can be omitted.

17 Claims, 7 Drawing Sheets

(56) References Cited

U.S. PATENT DOCUMENTS

| | | | |
|---|---|---|---|
| 6,368,562 B1 | 4/2002 | Yao | |
| 6,521,188 B1 | 2/2003 | Webster | |
| 6,590,267 B1 | 7/2003 | Goodwin-Johansson et al. | |
| 6,626,417 B2 | 9/2003 | Winger et al. | |
| 6,666,658 B2 | 12/2003 | Takeuchi et al. | |
| 6,679,279 B1 | 1/2004 | Liu et al. | |
| 6,767,194 B2 | 7/2004 | Jeon et al. | |
| 6,794,723 B2 | 9/2004 | Takeuchi et al. | |
| 6,802,489 B2 | 10/2004 | Marr et al. | |
| 6,807,892 B2 | 10/2004 | Biegelsen et al. | |
| 6,810,713 B2 | 11/2004 | Hahn et al. | |
| 6,837,476 B2 | 1/2005 | Cabuz et al. | |
| 6,838,304 B2 | 1/2005 | Ikeda et al. | |
| 6,934,435 B2 | 8/2005 | Kane | |
| 6,946,315 B2 | 9/2005 | Ikeda et al. | |
| 6,986,500 B2 | 1/2006 | Giousouf et al. | |
| 7,060,227 B2 | 6/2006 | Staats | |
| 7,075,162 B2 | 7/2006 | Unger | |
| 7,081,189 B2 | 7/2006 | Squires et al. | |
| 7,156,487 B2 | 1/2007 | Chou et al. | |
| 7,168,675 B2 | 1/2007 | Cabuz et al. | |
| 7,195,465 B2 | 3/2007 | Kane et al. | |
| 7,222,639 B2 | 5/2007 | Bonne et al. | |
| 7,232,109 B2 | 6/2007 | Driggs et al. | |
| 7,258,774 B2 | 8/2007 | Chou et al. | |
| 7,328,882 B2 | 2/2008 | Wang et al. | |
| 7,351,303 B2 | 4/2008 | Liu et al. | |
| 7,419,638 B2 | 9/2008 | Saltsman et al. | |
| 7,474,180 B2 | 1/2009 | Bintoro et al. | |
| 7,524,464 B2 | 4/2009 | Ahn et al. | |
| 7,550,810 B2 | 6/2009 | Mignard et al. | |
| 7,600,533 B2 | 10/2009 | Tai et al. | |
| 7,611,673 B2 | 11/2009 | Kartalov et al. | |
| 7,691,623 B2 | 4/2010 | Jobst et al. | |
| 7,741,123 B2 | 6/2010 | Pease et al. | |
| 7,799,553 B2 | 9/2010 | Mathies et al. | |
| 7,832,429 B2 | 11/2010 | Young et al. | |
| 7,842,248 B2 | 11/2010 | McAvoy et al. | |
| 2004/0151629 A1 | 8/2004 | Pease et al. | |
| 2004/0188648 A1 | 9/2004 | Xie et al. | |
| 2004/0209354 A1 | 10/2004 | Mathies et al. | |
| 2005/0092662 A1 | 5/2005 | Gilbert et al. | |
| 2005/0098750 A1 | 5/2005 | Sobek | |
| 2005/0161327 A1 | 7/2005 | Palmieri | |
| 2005/0223783 A1 | 10/2005 | Spivak | |
| 2006/0014083 A1 | 1/2006 | Carlson | |
| 2006/0180779 A1 | 8/2006 | Allen et al. | |
| 2008/0087855 A1 | 4/2008 | Wang et al. | |
| 2009/0056822 A1 | 3/2009 | Young et al. | |
| 2009/0256218 A1 | 10/2009 | Mignard et al. | |

OTHER PUBLICATIONS

Gong et al., Direct-referencing two-dimensional-array digital microfluidics using multilayer printed circuit board, Journal of microelectromechanical systames, vol. 17, No. 2, Apr. 2008, p. 257-264.*

Paul et al., Lamination-based rapid prototyping of microfluidic devices using flexible thermoplastic substrates, Electrophoresis 2007, 28, p. 1115-1122.*

H.T.G. van Lintel et al., "A piezoelectric micropump based on micromachining of silicon", Sensors and Actuators, vol. 15, No. 2, pp. 153-167 (1988).

E. Stemme and G. Stemme, "A valveless diffuser/nozzle-based fluid pump", Sensors and Actuators A. vol. 39, No. 2, pp. 159-167 (1993).

T. Ohori et al., "Partly disposable three-way microvalve for a medical micro total analysis system (μTAS)", Sensors and Actuators A. vol. 64, No. 1, pp. 57-62 (1998).

S. Böhm et al., "A plastic micropump constructed with conventional techniques and materials", Sensors and Actuators A. vol. 77, No. 3, pp. 223-228 (1999).

T.T. Veenstra et al., "Use of selective anodic bonding to create micropump chambers with virtually no dead volume", Journal of the Electrochemical Society, vol. 148, No. 2 pp. G68-G72 (2001).

D.C. Duffy et al., "Microfabricated centrifugal microfluidic systems: Characterization and multiple enzymatic assays", Analytical Chemistry, vol. 71, No. 20, pp. 4669-4678 (1999).

N.T. Nguyen et al., "MEMS-Micropumps: A Review", Journal of Fluids Engineering, vol. 124, No. 2, pp. 384-392 (2002).

W.H. Grover et al., "Monolithic membrane valves and diaphragm pumps for practical large-scale integration into glass microfluidic devices", Sensors and Actuators B, vol. 89, No. 3, p. 315-323 (2003).

C.K. Fredrickson and Z.H. Fan, "Macro-to-micro interfaces for microfluidic devices", Lab on a Chip, vol. 4, No. 6, pp. 526-533 (2004).

A. Groisman and S.R. Quake, "A microfluidic rectifier: Anisotropic flow resistance at low Reynolds numbers", Physical Review Letters, vol. 92, No. 9, pp. 094501-1 to 094501-4 (2004).

C.-H. Wang and G.-B. Lee, "Automatic bio-sampling chips integrated with micro-pumps and micro-valves for disease detection", Biosensors and Bioelectronics, vol. 21, No. 3, pp. 419-425 (2004).

P. Liu et al. "Integrated Portable Polymerase Chain Reaction-Capillary Electrophoresis Microsystem for Rapid Forensic Short Tandem Repeat Typing" Analytical Chemistry, vol. 79, No. 5, pp. 1881-1889 (2007).

C. Zhang et al., "Micropumps, microvalves, and micromixes with PCR microfluidic chips: Advances and trends", Biotechnology Advances, vol. 25, No. 5, pp. 483-514 (2007).

* cited by examiner (r) BOND/LAMINATE POLYMER LAYER (s) BOND/LAMINATE POLYMER LAYER (t) BOND/LAMINATE POLYMER LAYER

METHOD OF MAKING A MICROFLUIDIC DEVICE

FIELD OF THE INVENTION

This invention relates to the field of microfluidic systems, and more particularly to a method of making a microfluidic device, where the microfluidic device can itself be a platform for making a microfluidic system with multiple components.

BACKGROUND OF THE INVENTION

Two key components of any fluidic system are valves and pumps. These are the basic mechanisms for creating and controlling fluid flow. In lab-on-chip (LOC) applications, where analytic processes are carried out on a microchip, the need for pumps and valves remains, but new designs are required to fit within the constraints of available microfabrication processes. Unfortunately, current designs for microfabricated valves and pumps impose a significant chip-to-world burden, and this burden impedes progress towards greater miniaturization and integration of LOC systems.

Microfabrication processes, especially those suitable for mass production, are strongly biased towards planar geometries. This flattening of geometries makes traditional macroscopic designs unworkable or inefficient. This has affected the types of valves and pumps that are being used in LOC applications. For this reason many workers in the field have switched from mechanical pumps to other transduction mechanisms, such as electro-osmotic flow (EOF). However, these new mechanisms can have a number of significant drawbacks, such as affecting ion concentrations, which are significant when attempting to perform chemical reactions. For this reason, many groups have continued to use mechanical pumps. In particular, microfluidic "peristaltic" pumps have become very popular. Underlying the operation of peristaltic pumps, which are different in design from their macroscopic counterparts, is the operation of a sequence of active valves. In particular, existing processes actuate the valves and pumps using pneumatic control signals that are generated off-chip. This imposes significant interconnect burdens to the system design.

Even more critical is the fact that existing microfabrication processes support only limited system integration. Fluidic channels, valve, pumps, and aqueous contacts are commonly supported, but all other components are off-chip. A very small portion of the systems' overall complexity is embedded on the chip. This divide essentially creates a barrier to increased integration.

SUMMARY OF THE INVENTION

To achieve higher levels of integration, and thus lower costs and improve reliability, the number of off-chip interconnections is significantly reduced. The control signals are generated on-chip (or at least within the same package), thus providing an integrated microelectronic system.

Disclosed herein is a microfabrication process capable of building otherwise standard LOC valves and pumps, which can also accommodate the inclusion of electrostatic actuators. These electrostatic actuators are positioned such that they can replace the pneumatic controls. Instead of the myriad off-chip connections necessary to carry pneumatic signals, the fluidic components can be driven by electrical signals generated on-chip. This approach promotes increased integration of LOC systems, and thus reduces costs and improves reliability.

According to the present invention there is provided a method of making a microfabricated device, comprising: depositing a first metal layer on a substrate to provide a first electrode of an electrostatic actuator; depositing a first structural polymer layer over said first metal layer; depositing a second metal layer over said first structural polymer layer to form a second electrode of the electrostatic actuator; depositing an insulating layer over said first structural polymer layer; planarizing said insulating layer; etching said first structural polymer layer through said insulating layer and said second metal layer to undercut said second metal layer; providing additional pre-formed structural polymer layers, at least one of which has been previously patterned; and bonding said additional structural layers in the form of a stack over said planarized second insulating layer to define at least one microfluidic channel. In this context the microfluidic device can itself be a platform for making a microfluidic system with multiple components.

In another aspect the invention provides a method of making a microfabricated device, comprising depositing a first structural polymer layer over said substrate; depositing an insulating layer over said first structural polymer layer to define a hard mask; planarizing said insulating layer; etching said first structural polymer layer through said insulating layer; providing additional pre-formed structural polymer layers, at least one of which has been previously patterned; and bonding said additional structural layers in the form of a stack over said planarized second insulating layer to define at least one microfluidic channel.

In yet another aspect the invention provides a microfabricated structure, comprising upper and lower electrodes of an electrostatic actuator separated by a first structural polymer layer, wherein the first structural polymer is undercut to expose a gap between the first and second electrodes; and a stack of additional structural polymer layers bonded over said upper electrode to define microfluidic channels.

The layers may be bonded by direct mutual application or laminated together. The term "bonded" is defined to include lamination. It will be also understood that in the case of a layer applied over or on an underlayer, there may be one or more intervening layers.

The invention further provides a microfabricated structure, comprising a substrate; a polymer layer on the substrate, and a planarized inorganic layer applied over the polymer layer; wherein the inorganic layer serves as a hard mask for the polymer layers.

Although the invention is described with reference to a particular orientation, it will be appreciated that this is arbitrary and merely used for convenience of description. The orientation depends on how the device is mounted and is referred to herein as in the vertical orientation for convenience of description.

The polymer layers may be transferred using a transfer bonding process wherein they are first bonded on one side by a weak bond to a carrier, and then bonded on the other side to the underlying layer by a strong bond. Subsequently, the carrier can be removed.

Embodiments of the invention thus provide a process flow for the microfabrication of fluidic components supporting a high level of integration. Using this process, one can fabricate systems containing many different miniature components, and many different types of components, in an integrated manner. The process flow can be carried out in standard high-volume semiconductor manufacturing equipment. The process flow is compatible with CMOS processing, and so can be run as a post-processing step on CMOS wafers.

BRIEF DESCRIPTION OF THE DRAWINGS

The invention will now be described in more detail, by way of example only, with reference to the accompanying drawings, in which:—

DETAILED DESCRIPTION OF AN EMBODIMENT OF THE INVENTION

Figure 1:
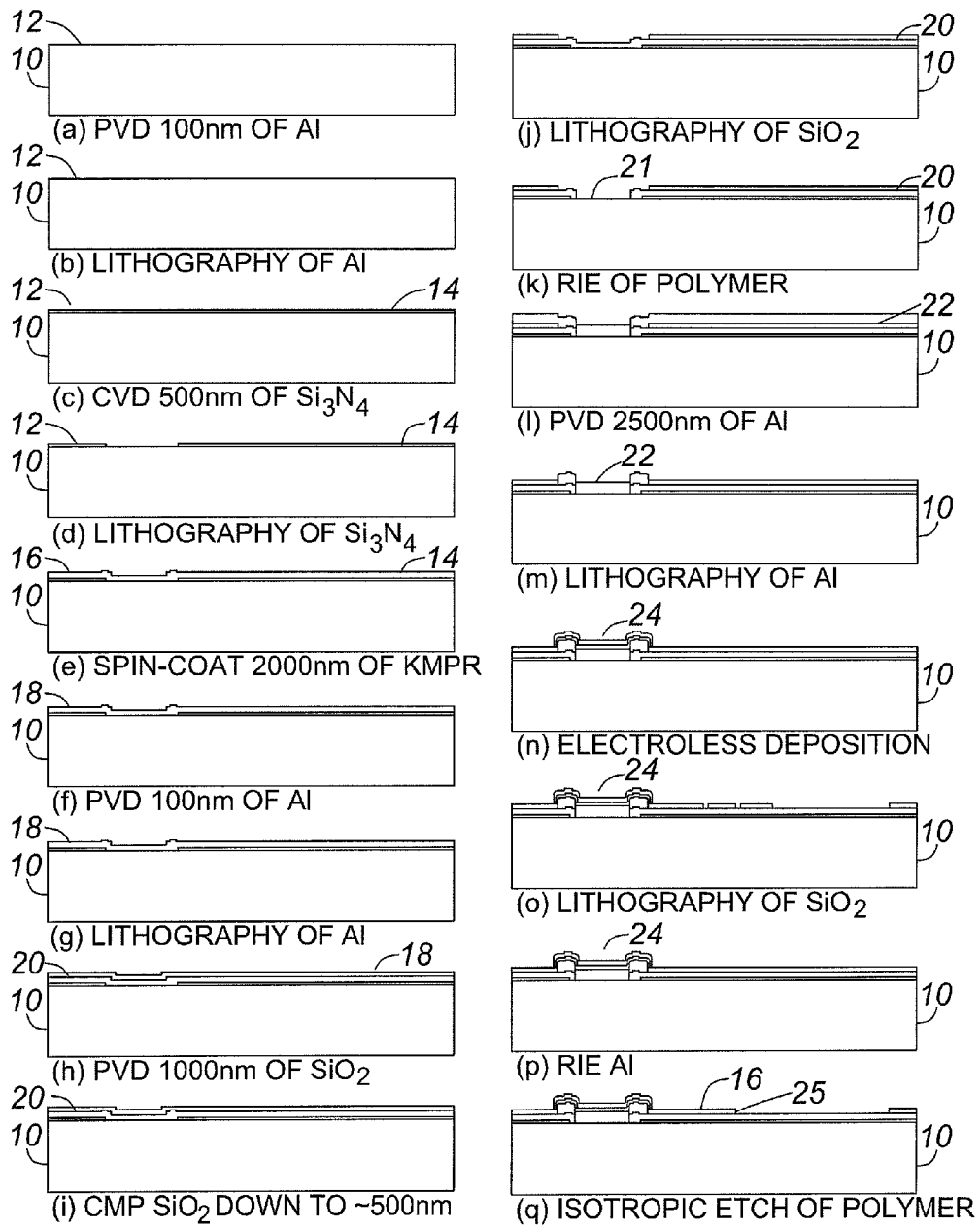
FIGS. 1a to 1t illustrate a process flow for a method in accordance with an embodiment of the invention.
Figure 1:
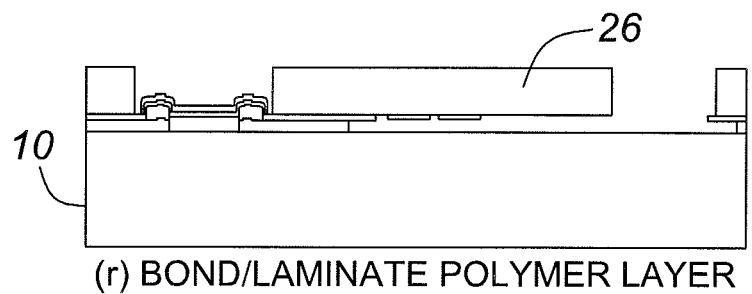
Figure 1:
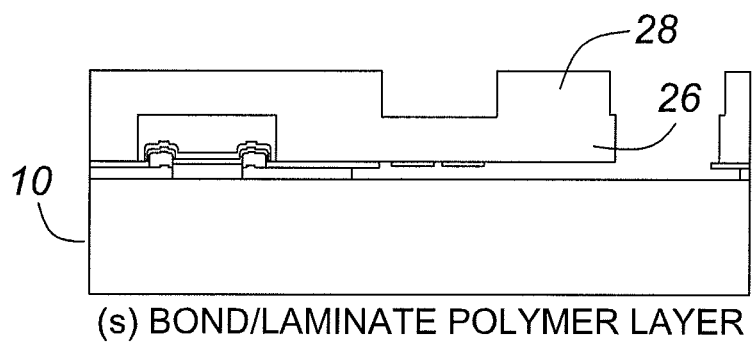
Figure 1:
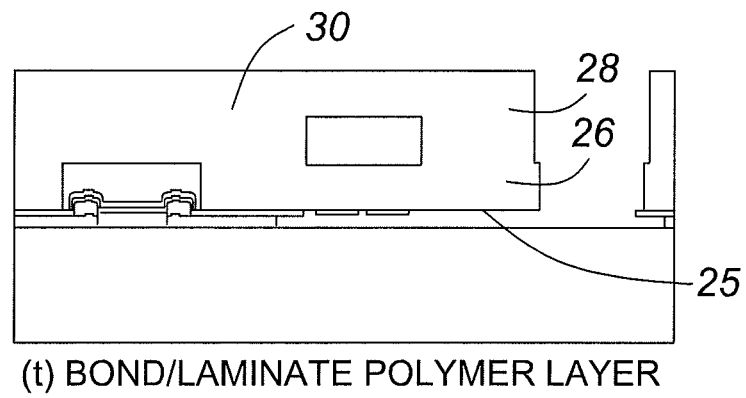

In the following description, in order to simplify the discussion, details relating to CMOS integration have been omitted. The process flow outline of a method in accordance with an embodiment of the invention shown in FIG. 1 starts from a fresh substrate 10, such as a silicon wafer, glass wafer, or other starting material. However, it should be noted that only minor modifications are required for the process to be applicable for use with CMOS wafers, and for the CMOS and fluidic systems to have multiple points of interconnection. For example, the substrate may include a charge coupled device, a CMOS image sensor or an avalanche diode.

One embodiment of the invention will be described below with reference to FIGS. 1a to 1t, which illustrate the various steps (a) to (t) to fabricate a microfluidic device.

In step (a) a layer 12 of 100 nm of Al is deposited by PVD (Plasma Vapor Deposition) on a silicon substrate 10.

In step (b) lithography is performed on the layer of Al 12 to start the fabrication of electrostatic actuators. Processing starts with the deposition of the first metal layer 12. This layer is used to create the bottom electrodes of the electrostatic actuator, but can also be used to make tracks for electrical routing.

In step (c) an insulating layer 14 of 500 nm of $Si_3N_4$ is deposited by CVD (Chemical Vapor Deposition).

In step (d) lithography is performed on the $Si_3N_4$ layer. The electrostatic actuators operate in "contact mode," which means that when sufficient voltage is applied, the membrane deflects past the pull-in voltage, and snap down. To prevent electrical shorting, an electrically insulating passivation layer is required, and this is provided by this silicon nitride layer.

In step (e) a spin-coat 16 of 2000 nm of a photopatternable epoxy-based polymer is applied. This layer is used to create the gaps between the bottom and top electrodes of the electrostatic actuator. SU-8 or KMPR™ photoresist is suitable for use as the polymer layer, although there are certainly many other suitable candidates. For the process, any polymer than can be spun at the appropriate thickness, etched in a pure $O_2$-plasma, and that provides the necessary dimensional and chemical stability would be a suitable candidate.

In step (f) a layer 18 of 100 nm of Al is applied by PVD.

In step (g) lithography of the Al layer 18 is performed to create the top electrodes. This metal layer is used to fabricate the top electrodes of the electrostatic actuators, but it can also be used to provide tracks for electrical routing.

In step (h) a layer 20 of 1000 nm of $SiO_2$ is applied by low-temperature CVD.

In step (i) CMP (Chemical Mechanical Polishing) of the $SiO_2$ layer 20 is performed down to ~500 nm. This layer is significant to the process flow, and physically separates the electrical and pneumatic sections of the chip from the fluidic regions. Other materials may be used instead of $SiO_2$, in particular $Si_3N_4$ or other inorganic materials. The choice of an inorganic provides good etch-selectivity for patterning. The oxide layer 20 serves two purposes with respect to achieving the overall goals of the microfabrication process. First, this layer is planarized in preparation for later bonding steps. The elimination of topography is important to form void-free bonding. Second, this layer serves as a hard mask for two further processing steps.

In step (j) lithography is performed on the $SiO_2$ layer 20.

In step (k) RIE (reactive ion etching) of the KMPR layer 16 is performed to etch holes through the first KMPR layer 16 to create openings 21 for electrical vias 24 (FIG. 1n). These electrical vias 24 provide conducting paths between the bottom and top electrodes.

In step (l) a PVD layer 22 of 2500 nm of Al is applied. This step fills the vias with metal. This metal provides the conducting paths between the two metal layers, creating the vias.

In step (m) lithography is performed on this Al layer 22. This removes excess metal from regions outside the vias.

In step (n) the vias are potentially capped with a noble metal so that, if exposed to fluid, the vias can also serve as aqueous contacts, and drive electrochemical reactions, electrophoresis, electroosmotic flow (EOF), or other aqueous or other solvent electrical interactions.

The vias 24 may be filled by depositing an additional metal layer by PVD and then patterning the metal layer so that it only remains in the vias (as described above), or alternatively by electroless deposition.

In step (o) lithography is potentially performed on the $SiO_2$ layer.

In step (p) a RIE (Reactive Ion Etch) is performed on the Al layer 22.

In step (q) an isotropic etch of the KMPR layer 16 is performed to undercut the $Al/SiO_2$ bilayer to create the electrode gaps 25. This completes the fabrication of the electrostatic actuators. Overetch of the KMPR during lithography is not an issue, as the underlying KMPR will be removed either way. Etching of the $SiO_2$ and the Al may be combined.

In step (r) a bond/laminate polymer layer 26 is applied. This second polymer layer is added to the materials stack through bonding or lamination. This avoids in-filling of the gaps previously created, which are necessary for the electrostatic actuators. The second polymer layer is used to form the "floor" of the eventual microfluidic channels. KMPR may be used for all polymer layers, although other materials may be substituted, such as SU-8, dry-films designed for lamination, etc. The layer is patterned prior to bonding. Alternatively, the polymer film may be patterned after bonding or lamination.

In step (s) a third bond/laminate polymer layer 28 is applied. The third polymer layer is used to create the walls for the microfluidic channels. The third polymer layer may be similar to the second polymer layer.

In step (t) the fourth bond/laminate polymer layer 30 is applied. The fourth polymer layer 30 is used to create the roofs for the microfluidic channels and is similar to the other polymer layers.

The process flow outlined above is capable of fabricating many important fluidic components, and is designed to serve as a platform technology for the development of LOC devices.

In another embodiment a fifth structural polymer layer (not shown) is formed under the second structural polymer layer to provide a floor to a lower fluidic channel formed on the underside of the second structural polymer layer. In yet another embodiment a fifth structural layer may be formed over the fourth structural polymer layer to provide a floor of a second microfluidic channel. As sixth structural polymer layer may then be applied over the fifth structural polymer layer to provide the roof for the second microfluidic channel.

A variety of devices that can be made by the described process are illustrated in FIGS. 2 to 10.

Figure 2:
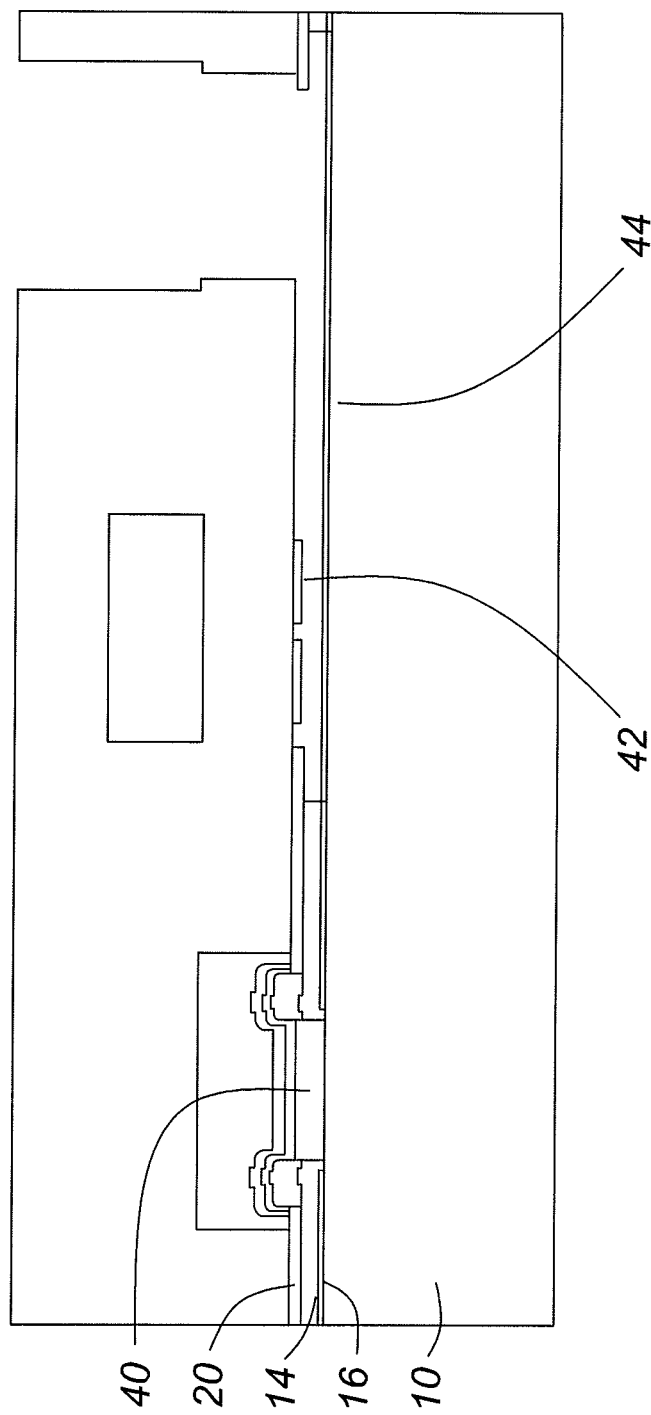
FIG. 2 is a cross section of a finished device made by a process described herein in accordance with an embodiment of the invention.

For example, FIG. 2 shows a finished device in which three components are visible. With minor modification at the mask-level (no changes in microfabrication process), it is also possible to make many additional components. The metal plug moving up past the silicon nitride layer 14, past the polymer 16, and rising over the oxide 20 forms a via 40 and serves to electrically connect the top and bottom electrodes 42, 44.

Figure 3:
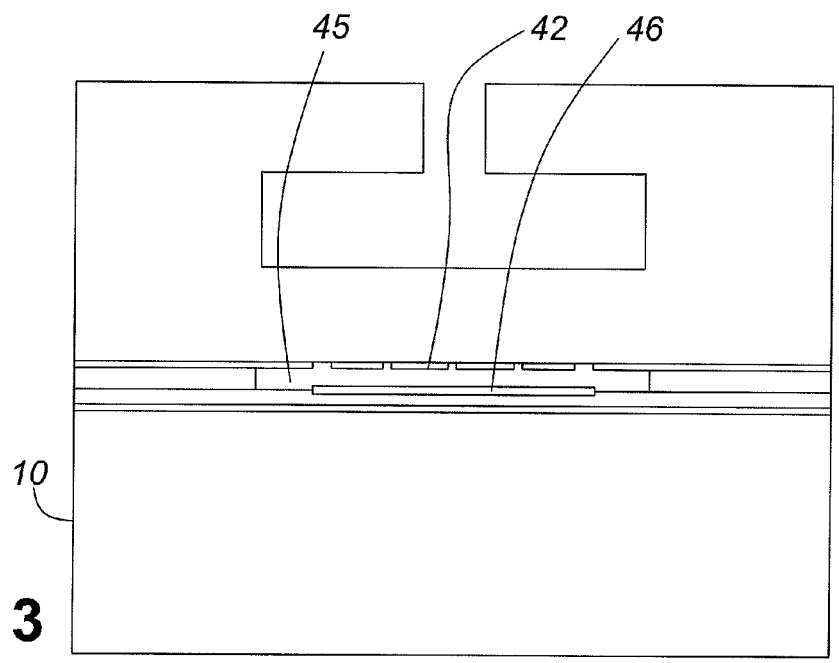
FIG. 3 is a cross section of an electrostatic actuator made by a process described herein.

An electrostatic actuator 42, 44 is shown in FIG. 3. In the middle of this figure, one can see two electrodes separated by an air gap 45, although a nitride passivation layer is also present. Applying a voltage difference across the electrodes 42, 44 will create an attractive force between the electrodes, which can be used to deflect the membrane connected to the top electrode.

Figure 4:
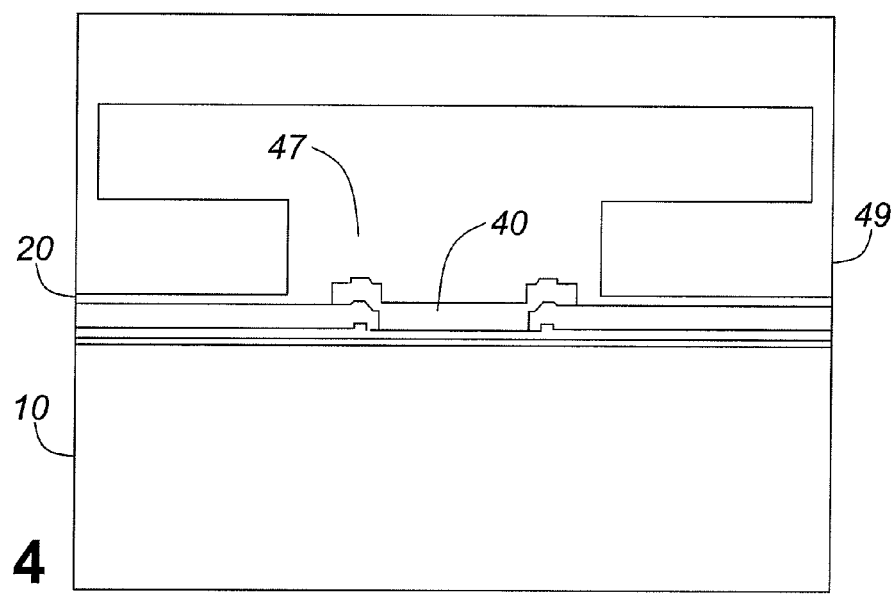
FIG. 4 is a cross section of an aqueous contact made by a process described herein.

An aqueous contact is shown in FIG. 4. In FIG. 4, the via 40 rises over the oxide layer 20, and requires that the polymer layer 49 used to create the floor include an opening 47. This opening is located so that it is in contact with an electrical via 40 such that the liquid in the opening 47 wet the top of the via 40. The structure therefore makes a point of electrical contact between the metal layers and the analyte.

Figure 5:
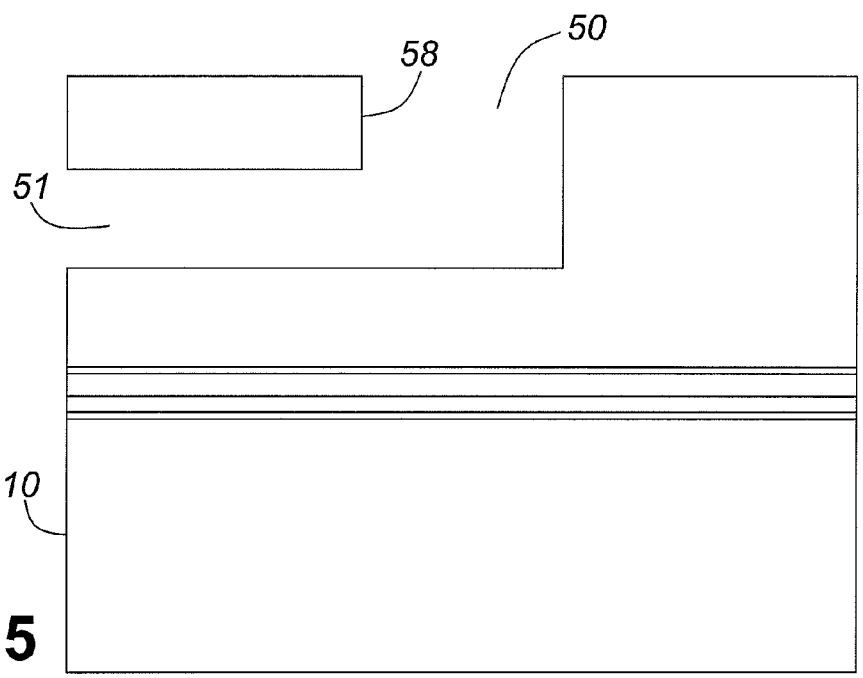
FIG. 5 is a cross section of a fluidic port made by a process described herein.

A fluidic port is shown in FIG. 5. An opening 50 in the roof polymer layer 58 allows access to the fluidic layer 51.

Figure 6:
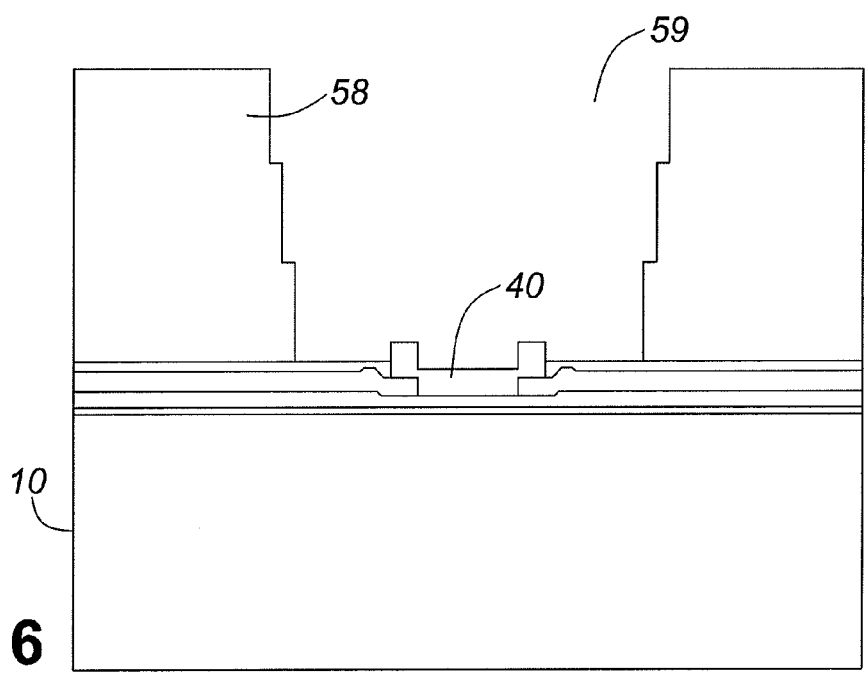
FIG. 6 is a cross section of an electrical pad made by a process described herein.

FIG. 6 shows an electrical pad formed by via 40 in an opening 59 in the polymer layers.

Figure 7:
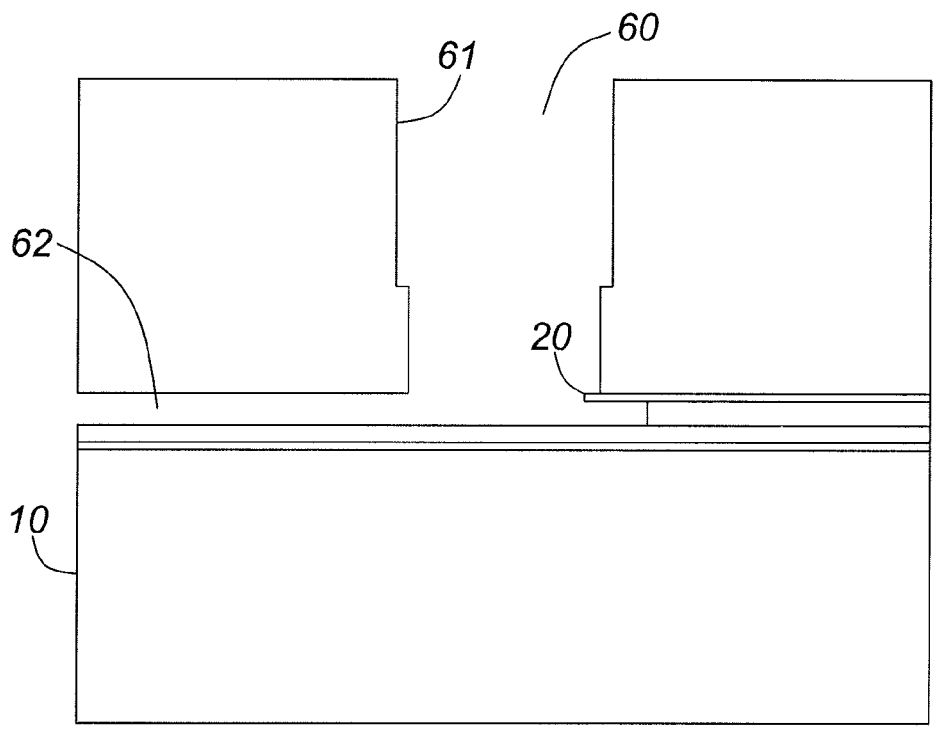
FIG. 7 is a cross section of a pneumatic port made by a process described herein.

A pneumatic port is show in FIG. 7. An opening 60 leads through all the polymer layers 61 and the oxide layer 20. This provides a path for air (or potentially another fluid) to travel from the ambient to channels or chambers in the first polymer layer. In this particular example, this allows air to flow in and out of the chamber 62 with the electrostatic actuator, which would otherwise need to be compressed or expanded to achieve membrane deflection.

Figure 8:
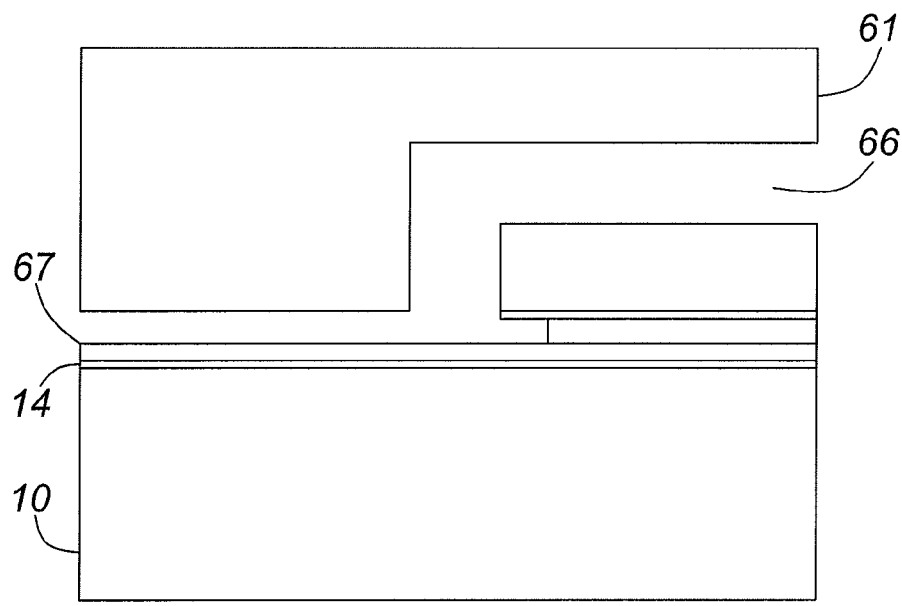
FIG. 8 is a cross section of a fluidic/pneumatic via made by a process described herein.

FIG. 8 shows a fluidic/pneumatic via 60 in the polymer layers. Air, water, or some other fluid, can travel from the first polymer layer to the third polymer layer, or vice versa. This further allows fluid cross-overs and complex fluidic routing. To further support this possibility, the nitride layer 14 may be further capped or replaced by a thin polymer passivation layer 67 so that the fluidic channels at all levels have homogeneous surface properties.

Figure 9A:
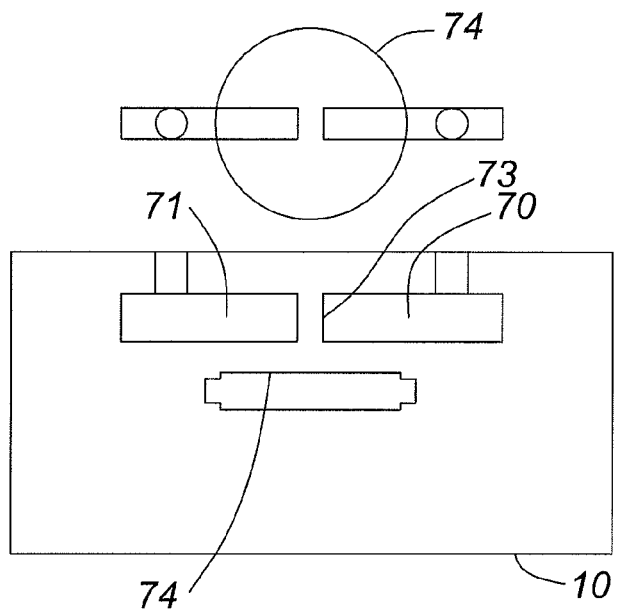
FIGS. 9A and 9B show an electrostatic valve made by a process described herein in the open and closed position.
Figure 9B:
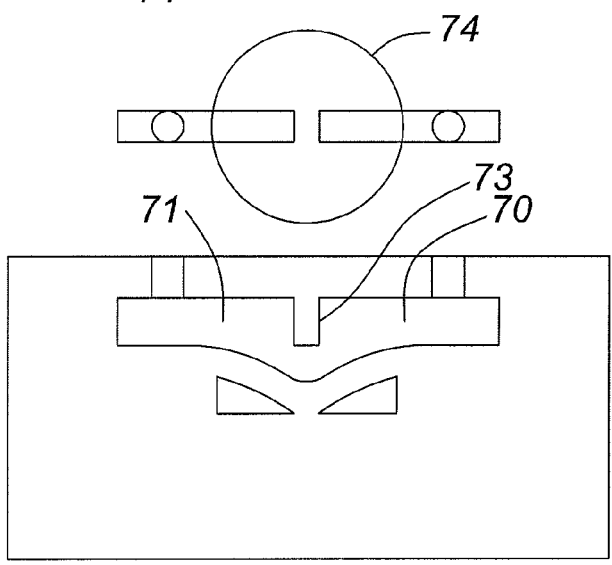

An electrostatic valve is shown in FIGS. 9A, 9B. The division of a channel or chamber 70 placed over a membrane 74 creates a valve. The valve contains a short blockage or divider 73 in the channel. This component will require an extension to the manufacturing process to prevent bonding of the wall to the top of the membrane. This can be accomplished through surface modification of the top of the membrane, etching a small groove into the top of the membrane layer, etching a small groove into the underside of the wall layer, or possibly other methods to prevent bonding at specific locations. The resulting device is similar to a Mathies' valve, except that electrostatic actuation replaces pneumatic actuation.

Figure 10:
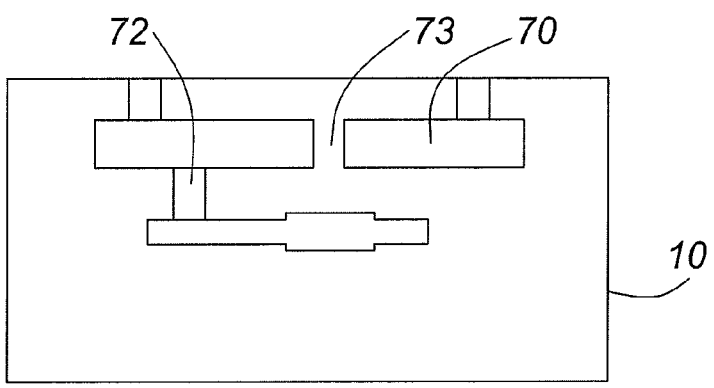
FIG. 10 is a cross section of a semi-active check valve made by a process described herein.

The addition of a via 72 in the membrane on one side of the valve seat equalizes the pressure across that half of the membrane, converting the structure to a check-valve as shown in FIG. 10. This device can be used to rectify fluid flow.

A further addition is to include electrodes to create an electrostatic actuator. This allows the valve to be held open electrostatically, which allows bidirectional flow. This device thus acts as a semi-active check-valve.

It will thus be seen that a variety of different components that can be built using this polymer manufacturing process. An electrostatic actuator for a microfluidic valve can be integrated within a four layers polymer manufacturing process, using two metal layers (and possible vias between them). The overall process perspective shows two microfluidic layers that can cross over, one targeted for fluid transport (top) and one targeted for air displacement (bottom).

The microfabrication process described herein is closely aligned with modern microfabrication methods. The invention uses readily available microfabrication materials using existing fabrication techniques. As a result the novel process is compatible with high-volume manufacturing.

The check-valves described herein can replace the inlet and outlet valves of current LOC pumps, and those pumps will continue to work. The process described herein therefore complements existing LOC practices, and adds values to those processes. For example, the inventive process is compatible with glass-PDMS-glass, glass-PDMS-glass-glass, and SU-8 laminate microfabrication processes. By working with and simplifying existing LOC designs, costs can be reduced.

The microfabrication process described herein permits the elimination of pneumatic connections, which are a limitation of current LOC devices. Because of their relatively large size, pneumatic connections limit the amount of functionality that can be integrated on-chip, increasing overall system costs. Additionally, as a mechanical connection that must be set at time-of-use, pneumatic connections reduce reliability and increase the need for operator training One of the major limitations of many polymer materials, such as PDMS, used in LOC devices is that any processing or operation of the device is limited to approximately 100° C. to prevent changes in the material properties, such as degradation of the polymer or changes in its mechanical properties. This process described herein does not require the use of PDMS, and can tolerate temperatures as high as 250° C. The assembly process, which typically uses soldering temperatures similar to these temperatures, is therefore compatible with high volume electrical systems manufacturing. The operating temperature of the LOC device itself can also be raised to meet the military standard of 125° C.

The microfabrication process described herein is compatible with typical CMOS manufacturing processes, and therefore allows the monolithic integration of both technologies. Further, the use of electrostatic actuation for valves and pumps makes integration of active elements with the supporting electronics relatively straightforward. One major advantage of semiconductor manufacturing processes is the ability to integrate multiple types of devices (components) within the same process. Designers then assemble these components in a myriad of ways to create a wide range of possible systems. The process described herein allows the integration of various type of electrostatic actuators, active valves and pumps, but also some passive components such as metallic vias between the metal layers, aqueous contacts, fluidic ports, electrical pads, pneumatic ports or fluidic/pneumatic vias. In a similar manner, the process provides a wide enough range of fundamental components to provide designers flexibility in the final system design.

We claim:

1. A method of making a microfabricated device, comprising:
    depositing a first metal layer on a substrate;
    patterning the first metal layer to provide bottom electrodes of an electrostatic actuator;
    depositing a first insulating layer over said first metal layer;
    patterning said first insulating layer;
    depositing a first structural polymer layer over said first insulating layer;
    depositing a second metal layer over said first structural polymer layer;
    patterning said second metal layer to form top electrodes of the electrostatic actuator;
    depositing a second insulating layer over said second metal layer;
    planarizing said second insulating layer;
    pattering said second insulating layer;
    performing an isotropic etch of said first structural polymer layer through said second insulating layer and said second metal layer to undercut said second metal layer to provide gaps between said top and bottom electrodes;
    bonding a first pre-formed structural polymer layer to said planarized second insulating layer to form a floor of at least one microfluidic channel; and
    bonding additional pre-formed structural polymer layers, at least one of which has been previously patterned, in the form of a stack over said planarized second insulating layer to define said at least one microfluidic channel.

2. The method of claim 1, wherein a reactive ion etch is performed on said first structural polymer layer to form at least one via interconnecting said first and second metal layers.

3. The method of claim 2, wherein the at least one via is filled with metal by depositing a third metal layer, and subsequently patterning the third metal layer so that it remains in said at least one via.

4. The method of claim 3, further comprising capping the at least one via with a noble metal.

5. The method of claim 1, wherein the first structural polymer is applied by spin coating.

6. The method of claim 1, wherein the insulating layer is planarized by CMP (Chemical-Mechanical Polishing).

7. The method of claim 1, wherein the substrate is a CMOS substrate with electrical connections to mounted on top.

8. The method of claim 1, wherein the substrate is selected from the group consisting of: a charge coupled device, a CMOS image sensor and an avalanche diode.

9. The method of claim 1, wherein the additional pre-formed structural polymer layers comprise a second pre-formed structural polymer layer over the first pre-formed structural polymer layer providing sidewalls of a microfluidic channel, and a third pre-formed structural polymer layer over the second pre-formed structural polymer layer providing a roof of a microfluidic channel.

10. The method of claim 9, wherein the additional pre-formed structural polymer layers further comprise a fourth pre-formed structural polymer layer under the first pre-formed structural polymer layer and providing a floor to a lower microfluidic channel formed on the underside of the first pre-formed structural polymer layer.

11. The method of claim 9, wherein the additional pre-formed structural polymer layers further comprise a fourth pre-formed structural polymer layer over the third pre-formed structural polymer layer and providing a floor to a second microfluidic channel, and a fifth pre-formed structural polymer layer over the fourth pre-formed structural polymer layer providing a roof for the second microfluidic channel.

12. The method of claim 1, wherein the additional pre-formed structural polymer layers are bonded by lamination.

13. The method of claim 1, wherein the stack of additional pre-formed structural polymer layersis formed by using a transfer-method wherein that additional pre-formed structural polymer layers are first bonded to a low adhesion substrate and then debonded for subsequent transfer to the stack.

14. The method of claim 1, wherein said structural polymer layer and said preformed structural polymer layers made of an epoxy-based polymer.

15. The method of claim 1, wherein said pre-formed structural polymer layers are made by a method selected from the group consisting of: lithography, hot embossing, and injection molding.

16. The method of claim 1, wherein the first insulating layer is silicon dioxide or silicon nitride deposited by a process selected from the group consisting of: low temperature PECVD, CVD and sputtering.

17. The method of claim 16, wherein the second insulating layer provides a hard mask for etching the first structural polymer layer.

\* \* \* \* \*